United States Patent [19]

Lin et al.

[11] Patent Number: 5,116,463

[45] Date of Patent: May 26, 1992

[54] DETECTING COMPLETION OF ELECTROLESS VIA FILL

[75] Inventors: Charles W. C. Lin, San Antonio; Randy L. German, Austin; Ian Y. K. Yee, Austin; David M. Sigmond, Austin, all of Tex.

[73] Assignee: Microelectroncs and Computer Technology Corporation, Austin, Tex.

[21] Appl. No.: 717,767

[22] Filed: Jun. 19, 1991

[51] Int. Cl.⁵ .............. B44C 1/22; B29C 37/00; C23F 1/00

[52] U.S. Cl. ................. 156/643; 156/627; 156/644; 156/655; 156/656; 156/659.1; 156/668; 156/902; 427/10; 427/97; 427/98; 427/307; 437/230

[58] Field of Search ........... 156/627, 643, 644, 655, 156/652, 656, 659.1, 664, 666, 668, 902; 427/9, 10, 96, 97, 98, 305, 307, 309; 437/203, 230, 235

[56] References Cited

U.S. PATENT DOCUMENTS

| | | | |
|---|---|---|---|
| 4,692,349 | 9/1987 | Georgiou et al. | 437/230 |
| 4,793,895 | 12/1988 | Kaanta et al. | 156/627 |
| 4,917,759 | 4/1990 | Fisher et al. | 156/643 |
| 4,954,214 | 9/1990 | Ho | 156/628 |
| 4,970,106 | 11/1990 | DiStefano | 156/656 X |

OTHER PUBLICATIONS

Tessier et al. "Process Considerations in Fabricating Thin Film Multichip Modules", International Electronics Packaging Society Conference Proceedings 1989, pp. 294-313.

Primary Examiner—William A. Powell
Attorney, Agent, or Firm—David M. Sigmond

[57] ABSTRACT

A method for detecting the completion of electrolessly depositing metal into a via. The method includes providing a non-autocatalytic detection mask with an opening over a via containing an autocatalytic material, electrolessly depositing a conductive metal into the via which fails to plate to the mask, and continuing the deposition until metal in the via contacts the mask, at which time the electrochemical potential of the mask changes and the metal plates to and covers the entire mask. The completion of the electroless via fill can be detected by changes in both the appearance and electrochemical potential of the mask.

37 Claims, 10 Drawing Sheets

DETECTING COMPLETION OF ELECTROLESS VIA FILL

BACKGROUND OF THE INVENTION

Current multi-chip circuitry design requires the attachment of numerous integrated circuit chips to high density electrical interconnects, also known as multi-chip-modules (MCMs) or as substrates. The electrical interconnects normally include surface pads for bonding to surface mounted chips, a dielectric, and electrical lines buried in the dielectric for connecting selected pads to provide electrical routing between various bond sites on the chips. It is common to use copper for the buried lines and polyimide as the dielectric. The copper lines may form separate layers of orthogonal wiring sets that are interconnected to the surface pads by vertical metal pillars. Thus the construction of metal pillars becomes an essential part of the overall electrical interconnect fabrication process.

The fabrication of such electrical interconnects is a rapidly emerging technology with a number of different material and process options. While many processes have been proposed and put to use by a number of companies, there is typically a serious problem with yields since a substantial percentage of the interconnects are found to be defective. The yield problem is affected by the operator's expertise, choice of equipment, process characterization, and perhaps most importantly the adequacy of the fabrication process self.

For instance, if electroplating is used as one of the fabrication steps then pillar uniformity is likely to be an unavoidable problem. Photosensitive polyimide appears to be promising, but currently suffers from several disadvantages including limited resolution, limited via aspect ration, a high coefficient of thermal expansion (CTE), and a highly limited shelf life. Furthermore, if electroless metallization is used with photosensitive polyimide, the process control (e.g., electroless bath chemistry, wafer preparation, plating conditions) is usually unable to meet the pre-determined, non-flexible plating rate requirement. A disadvantage of conventional electroless via fill plating approaches is the difficulty in detecting when the electroless deposition is completed and the interconnect substrate can be removed from the plating bath.

Consequently, there is a need for better electroless via fill endpoint control.

SUMMARY

An object of the present invention is to provide a simple and convenient technique for indicating the completion of electrolessly depositing metal into vias.

Another object of the present invention is a method of forming highly uniform metal pillars in a high density multilayer electrical interconnect (e.g. copper/polyimide substrates exceeding 300 lines per inch) by pattern electroless plating with a relatively simple, inexpensive and well-controlled process without the need for electroplating or a photosensitive dielectric.

A further object of the present invention is the use of a non-autocatalytic metal mask as a plasma etch mask, a plating completion indicator, an electroless via plating uniformity self-controller, and an adhesion layer between underlaying and overlaying layers.

A feature of the present invention is a method for electrolessly fabricating metal pillars in a dielectric and indicating the pillars are fabricated, which includes providing a flat first dielectric base, depositing a first electrically conductive metal over the first dielectric, depositing a second dielectric layer over the first metal, depositing over the second dielectric an electrically conductive detection mask containing an opening above a portion of the first metal, etching the second dielectric through the detection mask opening to form a via which exposes the portion of the first metal, electrolessly depositing a second electrically conductive metal into the via through the opening in the detection mask, wherein the first metal is autocatalytic to the electroless deposition, the detection mask is non-autocatalytic to the electroless deposition, and the second metal deposits on the exposed portion of the first metal and partially fills the via but fails to electrically connect the first metal to the detection mask and fails to deposit on the detection mask, continuing to electrolessly deposit the second metal into the via until the second metal fills the via, thereby forming a metal pillar in the via which electrically connects the first metal to the detection mask, at which time the second metal begins to deposit on the detection mask, continuing to electrolessly deposit the second metal until the second metal covers and changes the visual appearance of the top surface of the detection mask, and then discontinuing the electroless deposition of the second metal.

Another feature of the present invention is that completion of the electroless via fill is indicated by a change in both the visual appearance and electrochemical potential of the detection mask.

Advantages of the present invention include high uniformity between metal pillars particularly in comparison to electroplating, a convenient visual indication that the dielectric vias are filled with metal, fewer process steps than conventional mechanical polishing, lift-off or via-fill approaches, and the use of electroless plating without the need for electroplating or a photosensitive dielectric.

These and other objects, features and advantages of the present invention will be more readily apparent from a review of the detailed description and preferred embodiments which follow.

DETAILED DESCRIPTION OF THE PREFERRED EMBODIMENTS

The present invention will now be described in conjunction with a particularly preferred embodiment in which various layers of a high density multichip interconnect module are fabricated. During the initial steps, metal is selectively deposited on the dielectric, as shown in FIGS. 1-9.

Figure 1:
FIGS. 1-9 are fragmentary elevational views in cross-section illustrating successive stages for selectively depositing a metal on a dielectric.
Figure 2:
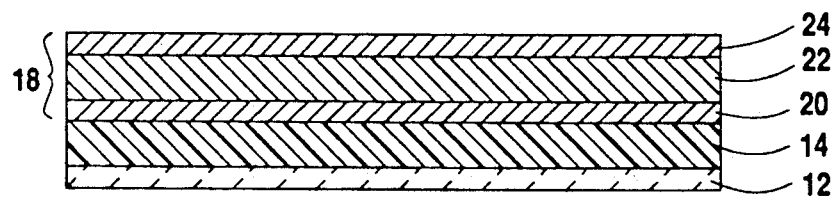
Figure 3:
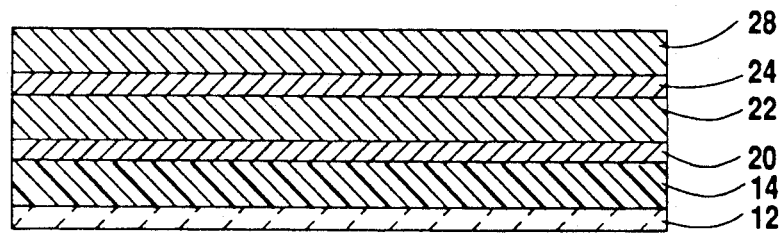
Figure 4:
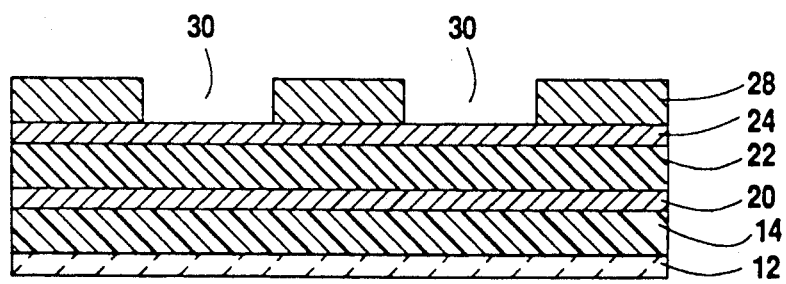
Figure 5:
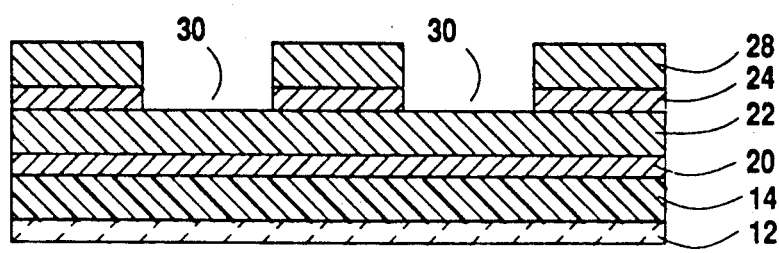
Figure 6:
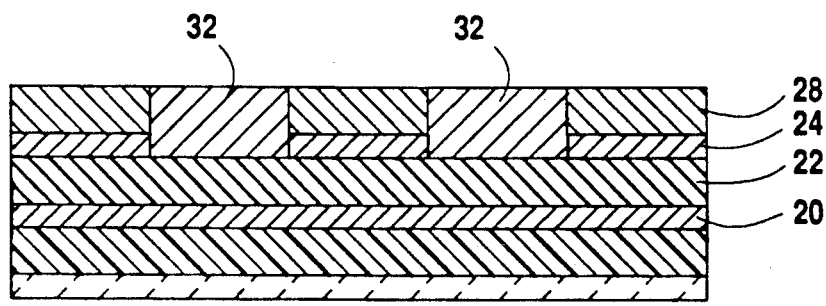
Figure 7:
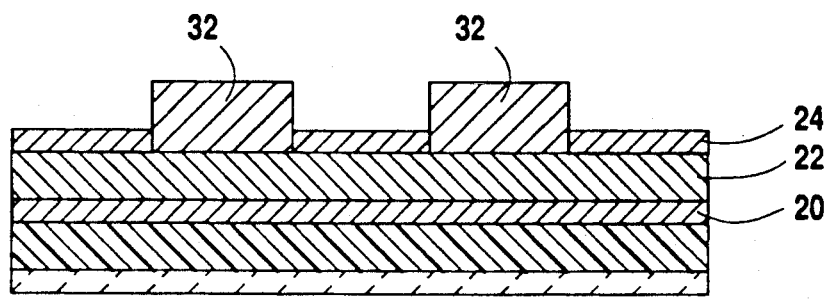
Figure 8:
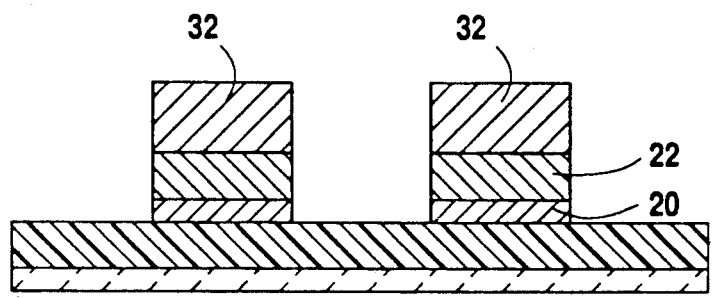
Figure 9:
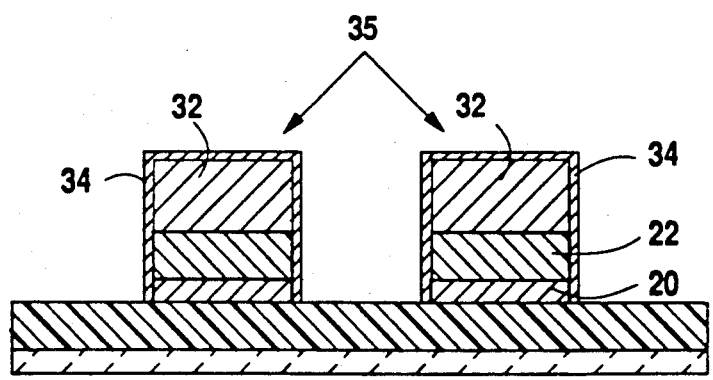

As seen in FIG. 1, the reference numeral 10 generally indicates any suitable substrate. Substrate 10 includes a ceramic base 12 covered with a dielectric layer shown as 10 micron thick polyimide 14 having a smooth top surface 16. Other suitable dielectrics include polymers such as polyquinoline and benzocylobutene. In FIG. 2, trilayer 18 is deposited on polyimide 14. Trilayer 18 consists of 500 angstroms chromium 20 deposited on polyimide 14, 2500 angstroms copper 22 deposited on chromium 20, and 500 angstroms titanium 24 deposited on copper 22. Layers 20, 22 and 24 are preferably sputter deposited. Chromium 20 provides adhesion between copper 22 and polyimide 14, copper 22 provides an electroless plating activator, and titanium 24 provides adhesion for overlaying photoresist as well as protection of copper 22 from oxidation and corrosion. In FIG. 3 first photoresist mask 28 is deposited on titanium 24, and in FIG. 4 mask 28 is patterned by standard lithographic techniques to form openings 30. In FIG. 5, titanium 24 exposed by openings 30 is etched in a mild solution such as 0.5% hydrofluoric acid. Thereafter, in FIG. 6 a first electrically conductive metal shown as lines of copper 32 deposited through openings 30 onto copper 22. Electroless deposition of copper 32 is preferred but other approaches such as electroplating are suitable. In FIG. 7 photoresist 28 is stripped, and in FIG. 8 titanium 24, copper 22, and chromium 20 outside copper 32 are etched and removed. In FIG. 9 an optional protective overcoat shown as electroless nickel 34 is deposited over copper 32. Nickel alloys are also preferred overcoats. Together, copper 32 and nickel overcoat 34 form copper/nickel 35.

Numerous other approaches for selectively depositing metal lines on a dielectric are known in the art. Conventional electrolytic plating will do. An electroless approach using a mask is taught in U.S. Pat. No. 4,701,351 by Jackson, and maskless laser direct-write patterning for electroless plating is described in U.S. Pat. No. 4,981,715 by Hirsch et al.

Additional steps can now performed to deposit a second layer of dielectric on the the first metal, provide a detection mask on the second dielectric, and form vias in the dielectric over the first metal. This is depicted in FIGS. 10-16.

Figure 10:
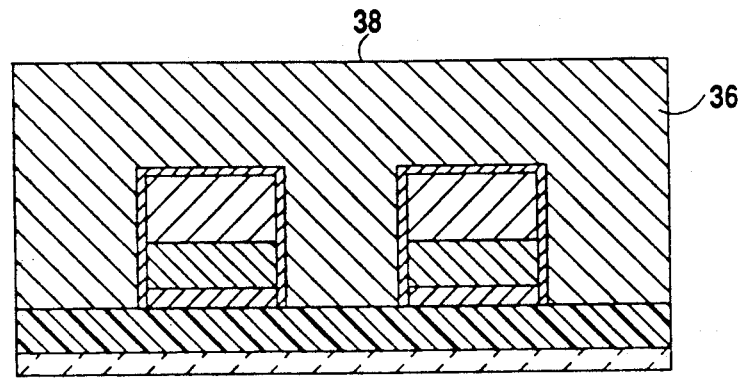
FIGS. 10-16 are fragmentary elevational views in cross-section illustrating successive stages for depositing a second layer of dielectric on the metal, providing a patterned detection mask on the second dielectric, and forming vias in the second dielectric.
Figure 11:
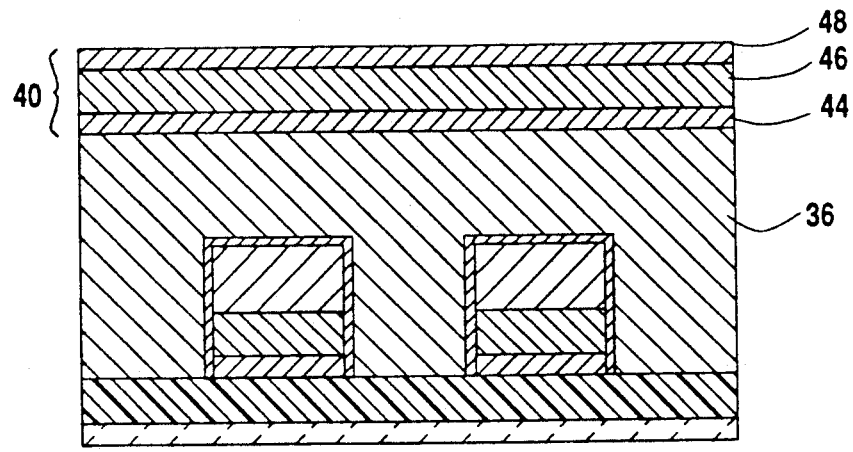
Figure 12:
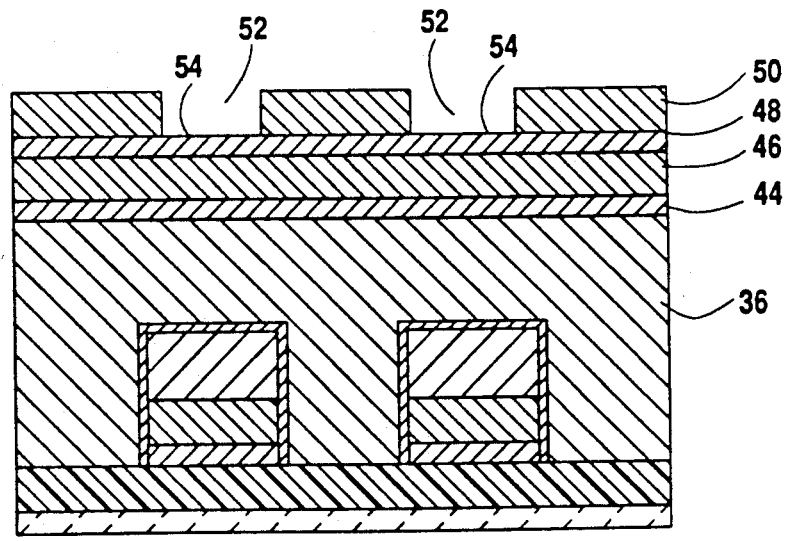
Figure 13:
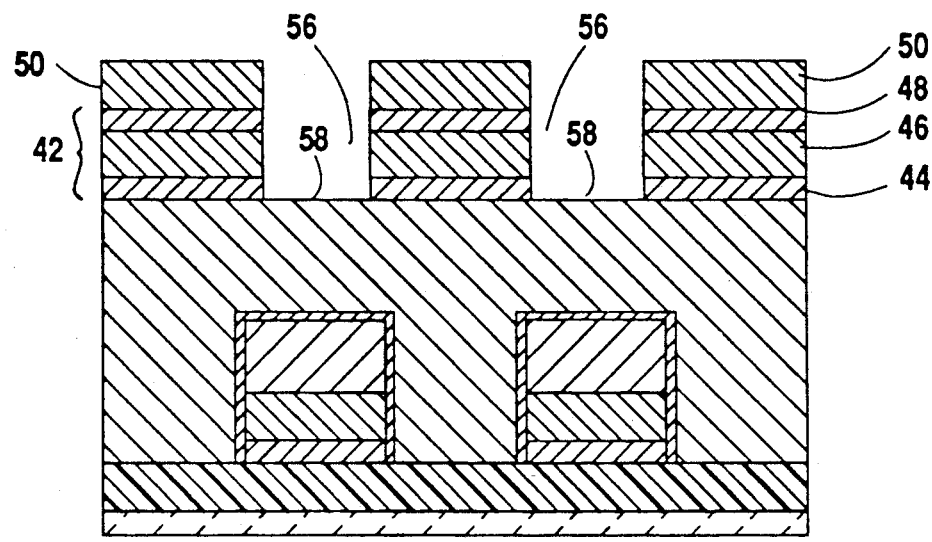
Figure 14:
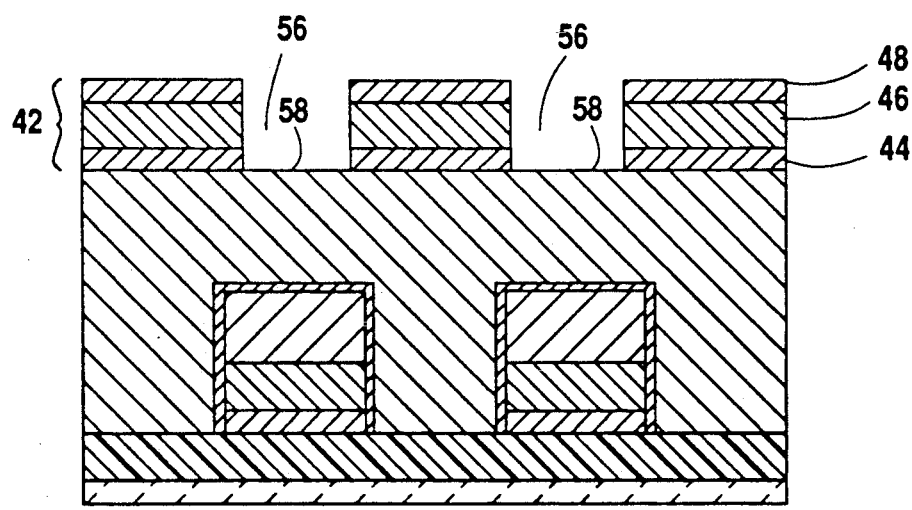
Figure 15:
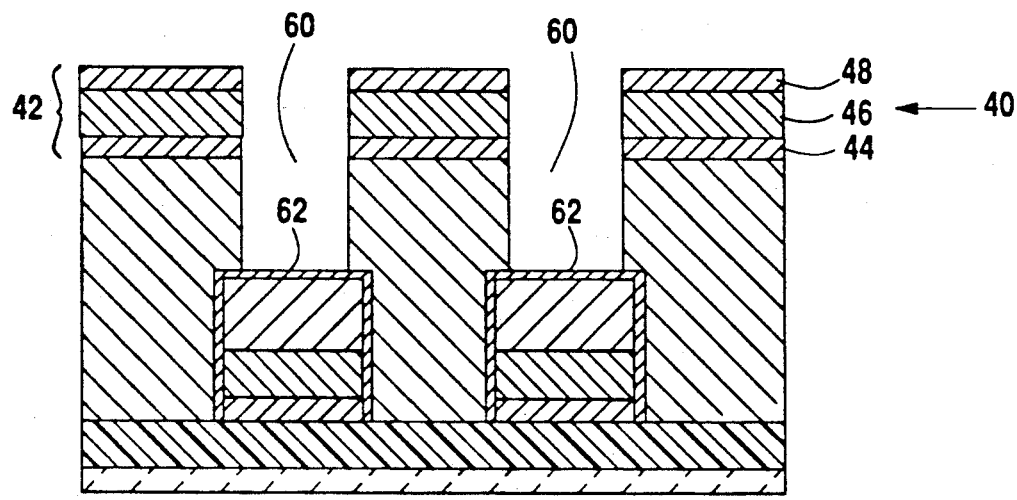
Figure 16:
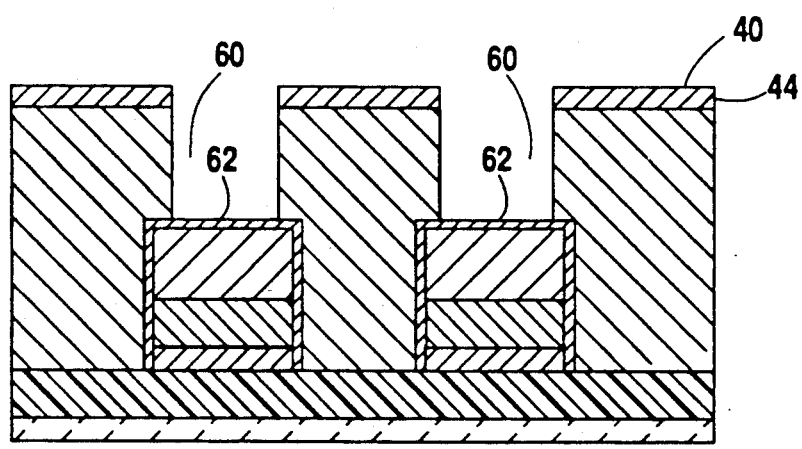

In FIG. 10, a second dielectric layer of polyimide 36 is coated over the first metal shown as copper/nickel 35 and the entire top of substrate 10, such as by spin coating or extrusion coating. Top surface 38 of polyimide 36 is then planarized by polishing. In FIG. 11, a detection mask 40 is deposited on polyimide surface 38. Detection mask 40 must be electrically conductive as well as non-autocatalytic (incapable of providing a seed or plating activator) for an electroless bath to follow. Suitable materials for the detection mask include chromium, aluminum, nickel, titanium, copper, tungsten, and combinations thereof, as well as conductive polymers. In some embodiments a particular detection mask material may be autocatalytic to a particular electroless bath, in which case the detection mask can be rendered non-autocatalytic by being coated with an inert oxide film. As shown, detection mask 40 is a trilayer 42 of sputtered titanium/copper/chromium similar to trilayer 18. Sputtered chromium 44 can be quite porous and when subjected to a plasma etch may allow etch pits to form in underlaying polyimide 36. Copper 46 minimizes this problem since the likelyhood of recesses in copper 46 aligning with recesses in chromium 44 is small. In addition, copper 46 is highly resistant to oxygen plasma etching which is commonly used for etching polymers. Titanium 48 further minimizes the formation of etch pits 44 and protects copper 46 from oxidation and corrosion. As seen in FIG. 12 a second photoresist mask 50 is deposited on detection mask 40 and selectively patterned to form openings 52 which expose regions 54 of detection mask 40. Openings 52 lay directly above a portion of copper/nickel 35 and define where the via holes (and metal pillars) will be positioned. In FIG. 13 the exposed detection mask regions 54 are etched to form detection mask openings 56. In addition, regions 58 of polyimide 36 become exposed. In FIG. 14 photoresist mask 50 is stripped. In FIG. 15 exposed polyimide regions 58 are oxygen plasma etched through detection mask openings 56 to form vertical cylindrical via holes or vias 60 which expose portions 62 of copper/nickel 35. Polyimide regions 58 can be etched by other suitable methods including laser drilling. In FIG. 16 titanium layer 48 and copper layer 46 are etched and removed, leaving only chromium layer 44 of detection mask 40. Chromium 44 alone can provide a better adhesion layer than the chromium/copper/titanium trilayer 42.

Figure 17:
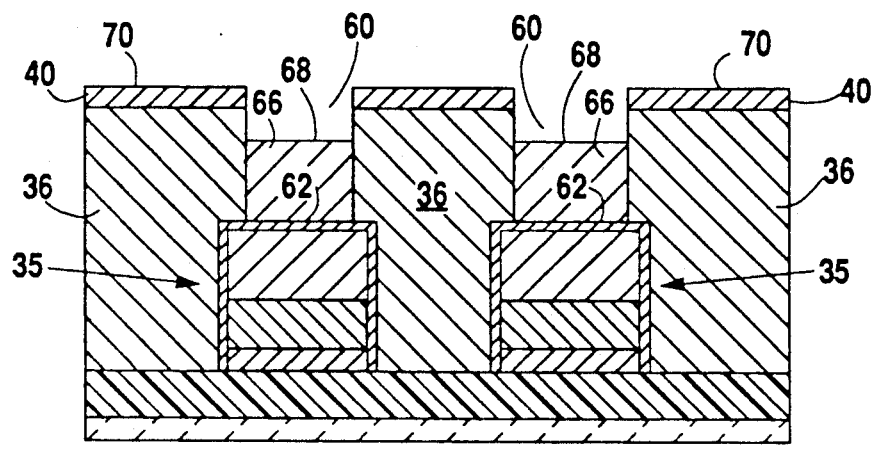
FIGS. 17-18 are fragmentary elevational views in cross-section illustrating successive stages for electrolessly filling the vias with metal to form uniform metal pillars indicating the vias are filled.
Figure 18:
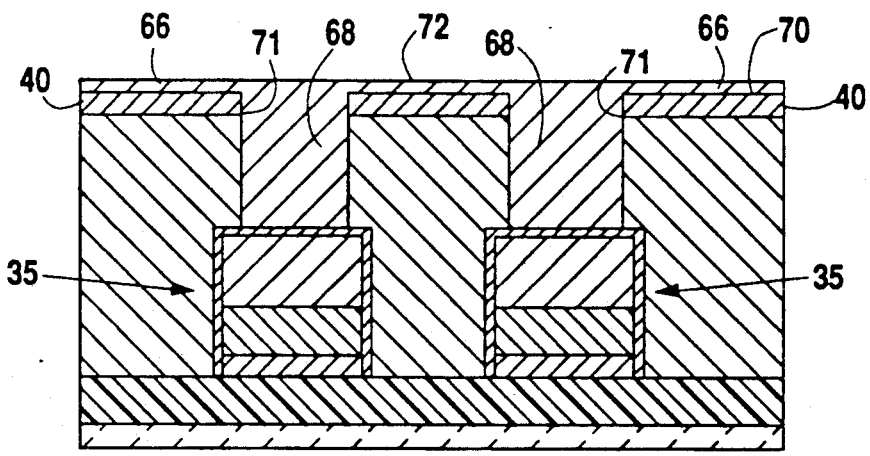

The purpose of the steps in FIGS. 17-18 is to 1) electrolessly deposit a second metal into the vias to form uniform metal pillars, and 2) provide an indication that the vias are filled.

With reference now to FIG. 17, a second electrically conductive metal is now electrolessly deposited into the vias. Suitable metals can be electrolessly deposited, such as chromium, gold, palladium, silver, copper and preferably nickel. Nickel is preferred over copper since nickel plates well to nickel without requiring a catalyst, whereas plating well-adhering copper to nickel or copper normally requires a catalyst, such as palladium, which might inadvertently end up on detection mask 40 as well. In all cases there must be an autocatalytic material (for which a metal in an electroless bath will spontaneously deposit thereon) provided in the via, illustrated herein as first metal 35 below vias 60. Conversly, dielectric 36 and detection mask 40 must each be non-autocatalytic. Initially, substrate 10 is immersed in an electroless nickel bath and nickel 66 is electrolessly deposited on exposed copper/nickel portions 62. It is critical to note that as nickel 66 begins to deposit into and partially fills (from bottom to top) vias 60, but before the deposited nickel 66 contacts detection mask 40 and electrically connects copper/nickel 35 to detection mask 40, nickel 66 does not plate to or cover top surface 70 of mask 40. Until at least one nickel pillar 68 reachs the top of it's surrounding via the nickel pillars shall fail to contact detection mask 40 (which lays above vias 60). Thus, prior to filling at least one via 60 with nickel 66, detection mask 40 is electrically isolated from copper/nickel 35 (which lays below vias 60) and nickel 66 will not plate or deposit on detection mask 40.

Referring now to FIG. 18, the electroless nickel plating is continued. Via fill occurs when the electrolessly deposited nickel 66 fills vias 60 to form nickel pillars 68. At this point at least one of nickel pillars 68 contacts detection mask 40 at a lower detection mask opening edge 71. Now nickel pillars 68 electrically connect copper/nickel 35 to mask 40, and two important changes occur. First, the electrochemical potential of mask 40 changes to the electroless plating electrochemical potential (of copper/nickel 35 and nickel pillars 68). For instance, the electrochemical potential of detection mask 40 may change from 0 volts to 0.2 volts. Furthermore, an electronic device such as a voltmeter can be provided to detect the change in electrochemical potential (voltage) of mask 40. The device can then communicate the completion of the via fill to an operator or to additional electrical equipment in order to discontinue the electroless bath. Second, as illustrated herein, as electroless nickel deposition continues nickel 66 begins to plate on and cover mask 40. In other words, the deposition of nickel 66 on detection mask 40 is not localized to the areas around nickel pillars 68. Instead, a nickel layer 72 is uniformly deposited over the entire top surface 70 of detection mask 40. As a result, the appearance of the entire top of the detection mask changes from the sputtered chromium's shiney fine grain appearance to electroless nickel's dull large grain appearance. If the mask is a different color than the second metal then obviously the completion of via fill will also be readily apparent. The visual contrast allows for visual detection that the vias are filled. Furthermore, detection mask 40 functions as a via electroless plating uniformity controller since nickel pillars 68 have uniform heights above detection mask top surface 70 equal to the thickness of nickel layer 72.

The present invention contrasts the prior art approach of electrolessly plating nickel pillars into vias in polyimide. In the prior art, once the vias are filled the nickel fails to plate the entire top surface of the polyimide, and instead forms nickel "mushrooms" over the vias. See T. G. Tessier et al. "Process Considerations in Fabricating Thin Film Multichip Modules," *International Electronics Packaging Society Conference Proceedings* 1989, pp. 294-313. Such miniature mushrooms are much harder for an operator to detect than a change in appearance of the entire top surface of the interconnect. In the present invention, nickel layer 72 provides for readily detectable visual contrast to mask 40 and thus allows for timely visual detection that nickel pillars 68 are completed and the electroless deposition can be discontinued. This prevents unnecessary time delays and provides better endpoint process control.

Referring now to FIGS. 19-23, if desired substrate 10 can undergo additional fabrication steps to form additional layers of a multilayer interconnect in accordance with one aspect of the present invention.

Figure 19:
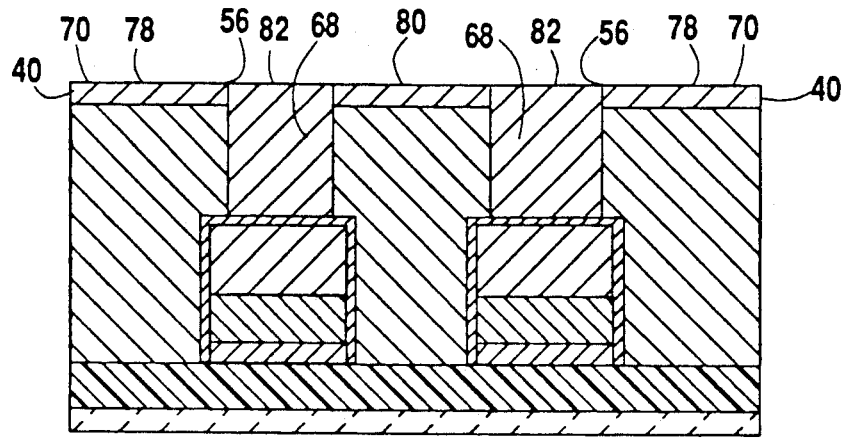
FIGS. 19-23 are fragmentary elevational views in cross-section illustrating successive stages for fabricating additional layers in accordance with one aspect of the present invention.
Figure 20:
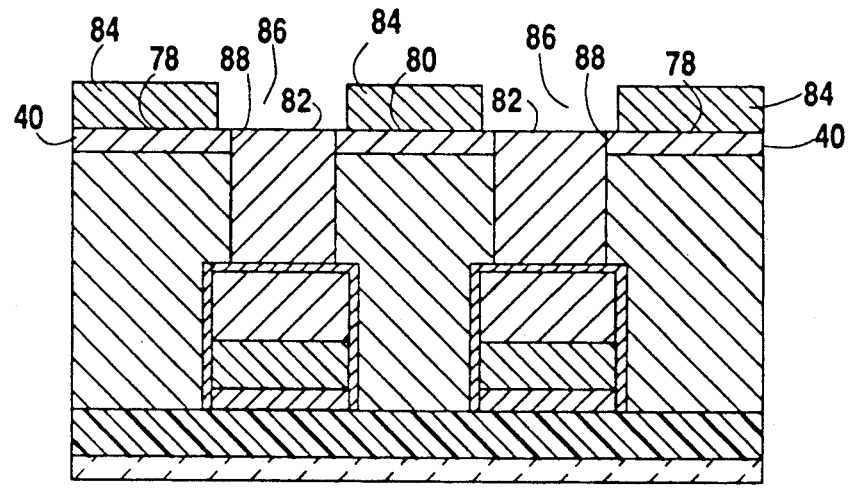
Figure 21:
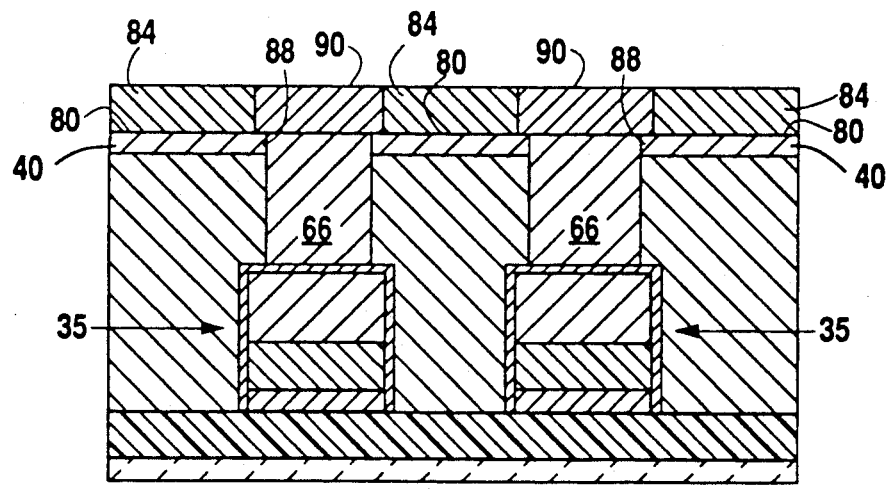
Figure 22:
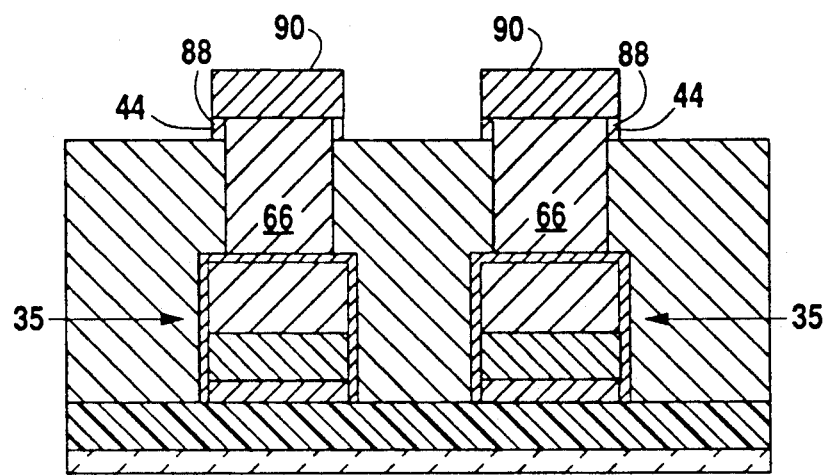
Figure 23:
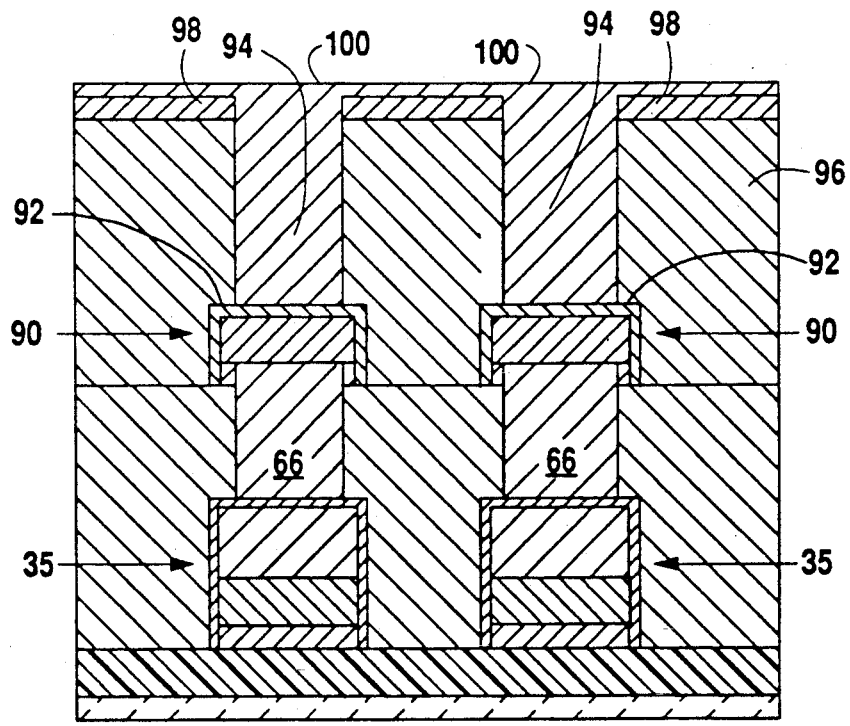

In FIG. 19 the nickel layer 72 above mask surface 70 is removed, such as by wet chemical etching or mechanical polishing. The current substrate top surface 80 consists of chromium top surface 78 and tops 82 of nickel pillars 68 in chromium openings 56. Nickel pillar tops 82 are in and aligned with chromium top surface 78 to form a smooth planar upper surface 80. In FIG. 20 a third photoresist mask 84 is deposited on top surface 80. Mask 84 is patterned with openings 86 which expose pillar tops 82 and adjacent regions 88 on chromium surface 78. In FIG. 21 a third electrically conductive metal such as chromium, gold, silver, nickel, or preferably copper 90 is electrolytically deposited through openings 86 on pillar tops 82 and adjacent detection mask regions 88. Copper 90 thus protrudes above surface 80 and can be patterned into a layer of circuitry or lines wider than pillars 66 and orthogonally oriented to copper/nickel lines 35. Alternatively, if additional buried lines are not necessary, copper 90 can be configured as bonding pads or bumps. In either case, nickel pillars 66 serve as wiring connections between copper/nickel 35 and copper 90. In FIG. 22 photoresist mask 84 is stripped, and chromium 44 outside copper 90 is etched and removed. Chromium portions 88, however, remain to provide adhesion between the underlaying polyimide 36 and overlaying copper 90. As seen in FIG. 23, the steps shown in FIGS. 9-18 can be repeated to fabricate a multilayer structure comprising second protective overcoat 92, second pillars 94, third dielectric 96, second detection mask 98, and second uniform layer 100 over second detection mask 98.

Referring now to FIGS. 24-27, if desired substrate 10 can undergo additional fabrication steps to form more layers in accordance with another aspect of the present invention.

Figure 24:
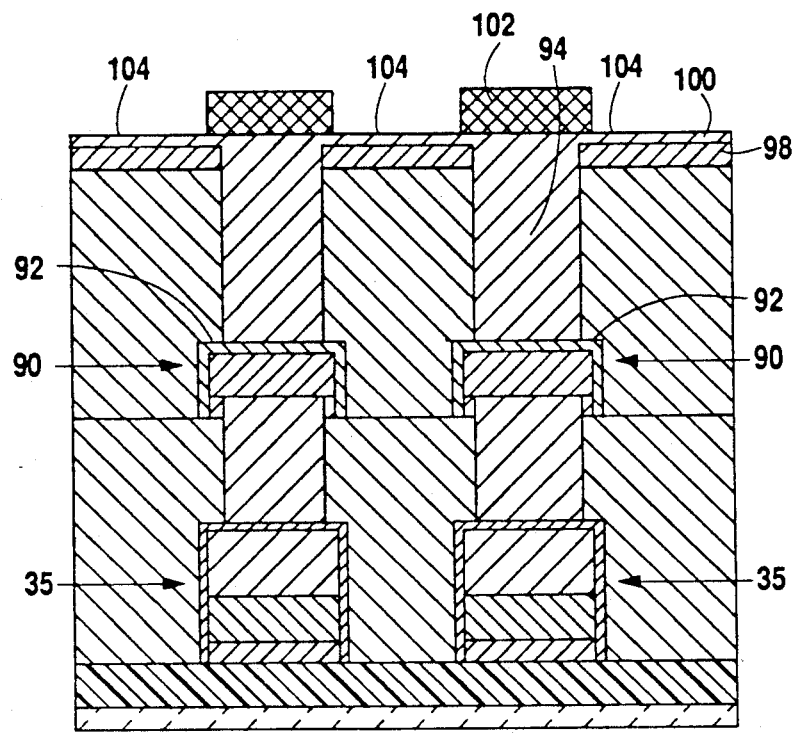
FIGS. 24-27 are fragmentary elevational views in cross-section illustrating successive stages for fabricating additional layers in accordance with another aspect of the present invention.
Figure 25:
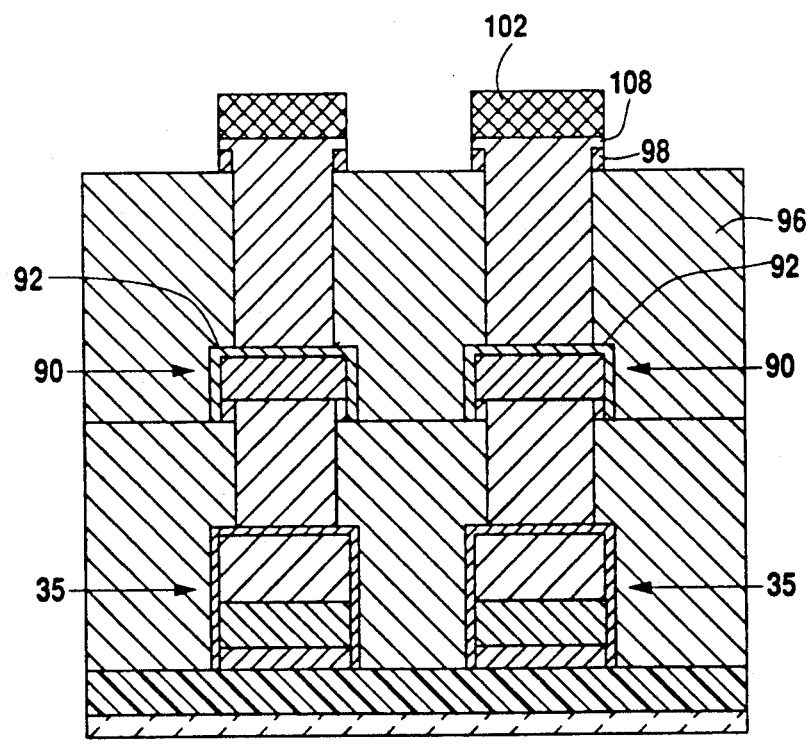
Figure 26:
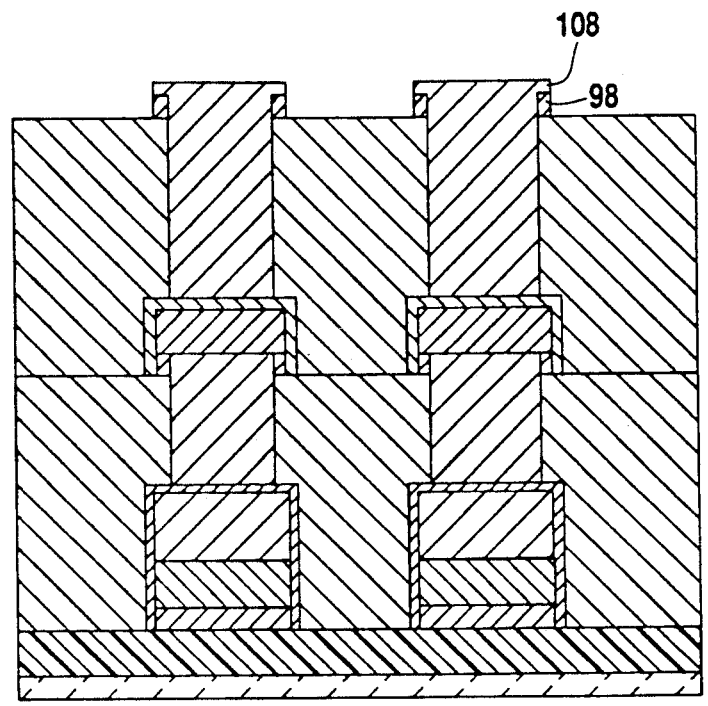
Figure 27:
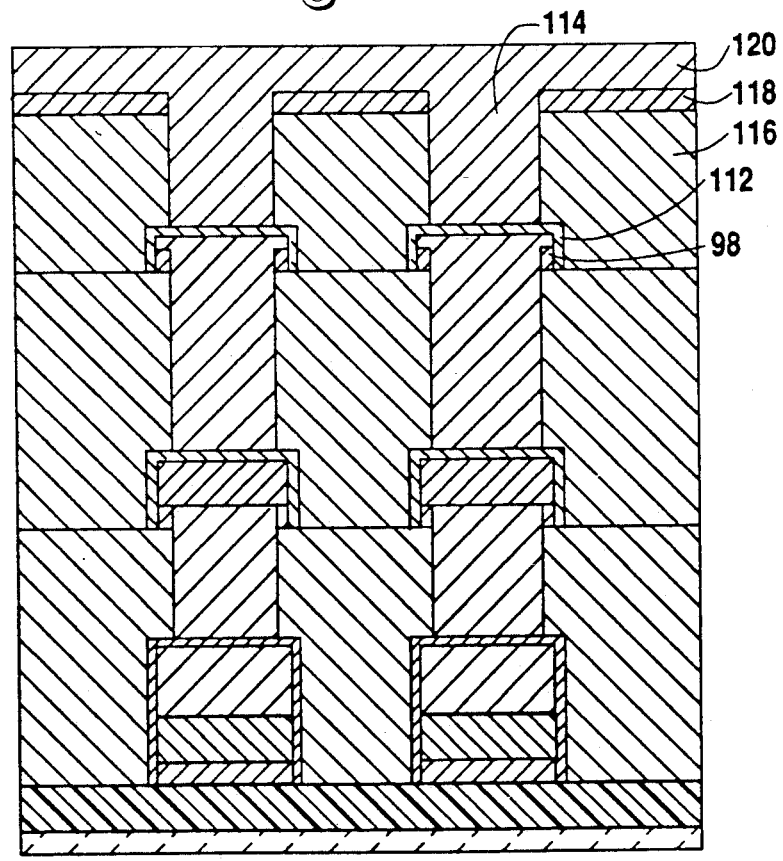

In FIG. 24 fourth mask 102 exposes portions 104 of second layer 100 but covers second pillars 94 and adjacent portions 106 of second detection mask 98. In FIG. 25, the exposed second layer portions 104 are wet etched and the second detection mask 98 beneath portions 104 is also removed by wet etching. This forms bumps 108 from unetched layer 100, and in FIG. 26 fourth mask 102 is stripped. Finally, in FIG. 27 the steps shown in FIGS. 9-18 are repeated to fabricate third protective overcoat 112, third pillars 114, fourth dielectric 116, third detection mask 118, and third uniform layer 120 over third detection mask 118.

The process for forming vertical pillar protrusions in FIGS. 24-27 may be simpler than that of FIGS. 19-23, however, the electrolessly deposited copper 100 (FIGS. 24-14 27) may not adhere to as well to the chromium 98 as the electrolytically plated copper 90 (FIGS. 19-23) adheres to chromium 44. While chromium can be treated to improve the adherence of electrolessly plated metals, the treatment is difficult.

The present invention is therefore well adapted to carry out the objects and attain the ends and advantages mentioned, as well as others inherent therein. While presently preferred embodiments of the invention have been described for the purpose of disclosure, numerous other changes in the details of construction and arrangement of parts may be made without departing from the spirit of the present invention and the scope of the appended claims.

What is claimed is:

1. A method for electrolessly fabricating metal pillars in a dielectric and indicating the pillars are fabricated, comprising the following steps:

providing a flat first dielectric base;

depositing a first electrically conductive metal over the first dielectric;

depositing a second dielectric layer over the first metal;

depositing over the second dielectric an electrically conductive detection mask containing an opening above a portion of the first metal;

etching the second dielectric through the detection mask opening to form a via which exposes the portion of the first metal;

electrolessly depositing a second electrically conductive metal into the via through the opening in the detection mask, wherein the first metal is autocatalytic to the electroless deposition, the detection mask is non-autocatalytic to the electroless deposition, and the second metal deposits on the exposed portion of the first metal and partially fills the via but fails to electrically connect the first metal to the detection mask and fails to deposit on the detection mask;

continuing to electrolessly deposit the second metal into the via until the second metal fills the via, thereby forming a metal pillar in the via which electrically connects the first metal to the detection mask, at which time the second metal begins to deposit on the detection mask;

continuing to electrolessly deposit the second metal until the second metal with a different visual appearance than the detection mask covers the top surface of the detection mask; and then discontinuing the electroless deposition of the second metal.

2. The method of claim 1, further comprising after discontinuing the electroless deposition of the second metal:

removing the second metal which covers the detection mask without removing the detection mask or the second metal in the detection mask opening.

3. The method of claim 2, further comprising after removing the second metal:

depositing a second mask over the top surface of the detection mask, the second mask comprising an opening which exposes the second metal in and the detection mask adjacent to the detection mask opening;

depositing a third electrically conductive metal into the second mask opening and on the exposed second metal and detection mask;

removing the second mask, wherein the third metal is electrically connected to the first metal; and stripping the detection mask outside the third metal, wherein the unstripped detection mask provides adhesion between the overlaying third metal and the underlaying second dielectric.

4. The method of claim 1, further comprising after discontinuing the deposition of the second metal:

depositing a second mask over the top surface of the second metal covering the detection mask, wherein the second mask covers the detection mask opening and detection mask regions adjacent the detection mask opening but exposes the second metal on the side of the adjacent regions opposite the detection mask opening;

etching the exposed second metal;

etching the detection mask exposed as a result of etching the second metal; and stripping the second mask, wherein the unetched detection mask provides adhesion between the overlaying second metal and the underlaying second dielectric.

5. The method of claim 1 wherein the first and second dielectrics are polymers.

6. The method of claim 1 wherein the first and second dielectrics are polymers selected from the group consisting of polyimide, polyquinoline and benzocyclobutene.

7. The method of claim 1 wherein first metal comprises copper, or copper coated with a coating selected from the group consisting of nickel and nickel alloys.

8. The method of claim 1 wherein the first metal is deposited by electroless plating.

9. The method of claim 1 wherein the first metal is selected from the group consisting of copper and nickel.

10. The method of claim 1, wherein as the second metal connects the first metal to the detection mask the electrochemical potential of the detection mask changes, and the change is detected by an electronic device.

11. The method of claim 1 wherein the second metal is selected from the group consisting of copper, chromium, nickel, gold, silver, and palladium.

12. The method of claim 1 wherein the detection mask is selected from the group consisting of chromium, aluminum, copper, titanium, nickel, tungsten, and combinations thereof.

13. The method of claim 1 wherein the detection mask contains a layer of chromium or titanium deposited on the second dielectric.

14. The method of claim 1 wherein the detection mask includes a conductive polymer.

15. The method of claim 3 wherein the second mask is photoresist.

16. The method of claim 1 wherein the second dielectric is etched by plasma etching.

17. The method of claim 1 wherein the second dielectric is etched by a laser beam.

18. The method of claim 2 wherein the second metal is removed by wet chemical etching.

19. The method of claim 2 wherein the second metal is removed by polishing.

20. The method of claim 1 wherein the first metal forms a horizontal conductive line and the second metal forms a vertical pillar thereon.

21. The method of claim 1 wherein the Second dielectric is etched through the opening in the detection mask.

22. The method of claim 1 wherein a plurality of uniform vertical metal pillars are formed over a plurality of first metal lines.

23. The method of claim 22, further comprising at least 300 first metal lines per inch.

24. A method for visually indicating the completion of electrolessly plating metal into a via in a dielectric, comprising:

providing a dielectric;

depositing a non-autocatalytic detection mask with an opening on a surface of the dielectric; the dielectric;

providing an autocatalytic material in the via; electrolessly plating an electrically conductive metal through the detection mask opening into the via, wherein the metal begins to fill the via but fails to plate on the detection mask until metal filled in the via is connected to the detection mask; and continuing to electrolessly plate the metal after the metal filled in the via is connected to the detection mask so that the metal plates to and covers the entire top surface of the detection mask, thereby providing a visual indication that the via is filled with metal and the electroless plating can be discontinued.

25. A method for providing visual detection of the completion of electrolessly plating a metal pillar into a via in a dielectric, comprising the following steps in the sequence set forth:

providing a dielectric with a top surface;

depositing a non-autocatalytic detection mask layer on the dielectric top surface;

forming a plurality of openings in the detection mask, wherein each opening exposes a separate portion of the dielectric top surface;

etching the exposed portions of the dielectric to form a plurality of vertical vias in the dielectric;

providing an autocatalytic material in each of the vias;

electrolessly plating an electrically conductive metal through the detection mask openings into the vias, wherein the metal partially fills the vias but fails to plate to or cover the detection mask;

continuing to electrolessly plate the metal through the detection mask openings into the vias until the metal fills a via to form a metal pillar which contacts the detection mask, thereby allowing the metal to begin to plate to the detection mask;

continuing to electrolessly plate the metal until the metal fills all the vias and all the detection mask openings and covers the entire top surface of the detection mask with a uniform layer, thereby allowing visual detection that uniform metal pillars have been formed; and discontinuing the electroless plating as a result of the visual detection.

26. The method of claim 25 wherein the metal is selected from the group consisting of copper, chromium, nickel, silver, gold, palladium and combinations thereof.

27. The method of claim 25 wherein the detection mask contains at least one of chromium or a conductive polymer.

28. The method of claim 25 wherein the dielectric is a non-conductive polymer and the detection mask is a conductive polymer.

29. The method of claim 25, wherein prior to electrolessly plating the metal, a second electrically conductive base metal is exposed at the ends of the vias opposite the dielectric top surface.

30. A method for indicating the completion of electrolessly depositing metal into a via, comprising:

providing a via in a dielectric;

providing an autocatalytic material in the via;

providing over the dielectric an electrically conductive non-autocatayltic detection mask with an opening above the via;

electrolessly depositing an electrically conductive metal into the via wherein the metal begins to deposit on the autocatalytic material and fill the via but fails to deposit on the detection mask; and continuing the electroless deposition until the metal filled in the via electrically connects the autocatalytic material to the detection mask, at which time the metal begins to deposit a uniform layer over the entire detection mask, thereby providing a visual indication that the via is filled with metal and the electroless deposition can be discontinued.

31. The method of claim 30, wherein
the detection mask is metallic,
the dielectric is a polymer, and
the via is vertical.

32. The method of claim 31, wherein
the metal comprises copper or nickel, and
the detection mask comprises chromium or titanium.

33. A method for electronically detecting the completion of electrolessly depositing metal into a via, comprising:

providing a via in a dielectric;

providing an autocatalytic material in the via;

providing over the dielectric an electrically conductive non-autocatayltic detection mask with an opening above the via;

providing an electronic device which is responsive to a change in the electrochemical potential of the detection mask;

electrolessly depositing an electrically conductive metal into the via wherein the metal begins to deposit on the autocatalytic material and fill the via but fails to deposit on the detection mask;

continuing the electroless deposition until the metal filled in the via electrically connects the autocatalytic material to the detection mask thereby changing the electrochemical potential of the detection mask; and detecting the change in electrochemical potential by the electronic device, whereby the device sends an electrical signal to indicate via fill is completed.

34. The method of claim 33, wherein the electrochemical potential of the detection mask changes approximately 0.2 volts.

35. The method of claim 34, wherein the electrochemical potential of the detection mask changes from approximately 0 volts to approximately 0.2 volts.

36. The method of claim 33, wherein
the detection mask is a metallic,
the dielectric is a polymer, and
the via is vertical.

37. The method of claim 36, wherein
the metal comprises copper or nickel, and
the detection mask comprises chromium or titanium.

* * * * *

UNITED STATES PATENT AND TRADEMARK OFFICE
CERTIFICATE OF CORRECTION

PATENT NO. : 5,116,463

DATED : May 26, 1992

INVENTOR(S) : Lin et al

It is certified that error appears in the above-indentified patent and that said Letters Patent is hereby corrected as shown below:

Column 1, line 30, change "self" to -- itself --.

Column 1, line 36, change "ration" to -- ratio --.

Column 3, line 31, insert -- is -- before "shown".

Column 3, line 50, delete the second occurrence of "the".

Column 4, line 7, change "likelyhood" to -- likelihood --.

Column 4, line 48, change "Conversly" to -- Conversely --.

Column 4, line 59, change "it's" to -- its --.

Column 6, line 1, change "Oriented" to -- oriented --.

Column 6, line 35, change "24-14 27" to --24-27 --.

UNITED STATES PATENT AND TRADEMARK OFFICE
CERTIFICATE OF CORRECTION

PATENT NO. : 5,116,463
DATED : May 26, 1992
INVENTOR(S) : Lin et al

It is certified that error appears in the above-indentified patent and that said Letters Patent is hereby corrected as shown below:

Column 6, line 35, delete the first occurrence of "to".

Column 7, line 62, insert -- the -- before "first".

Column 8, line 31, change "Second" to -- second --.

Column 8, lines 44-45, delete the second occurrence of "the dielectric;".

Column 8, line 45, insert as a new paragraph -- forming through the detection mask opening a via in the dielectric; --.

Column 8, line 46, delete "elec-".

Column 8, line 47, start a new paragraph and change "trolessly" to -- electrolessly --.

Signed and Sealed this

Twenty-fourth Day of August, 1993

Attest:

BRUCE LEHMAN

Attesting Officer     Commissioner of Patents and Trademarks